United States Patent [19]

Huebner

[11] Patent Number: 4,950,377

[45] Date of Patent: Aug. 21, 1990

[54] APPARATUS AND METHOD FOR REACTIVE ION ETCHING

[75] Inventor: Holger Huebner, Baldham, Fed. Rep. of Germany

[73] Assignee: Siemens Aktiengesellschaft, Berlin and Munich, Fed. Rep. of Germany

[21] Appl. No.: 388,804

[22] Filed: Aug. 3, 1989

[30] Foreign Application Priority Data

Sep. 23, 1988 [DE] Fed. Rep. of Germany ....... 3832447

[51] Int. Cl.⁵ ............................................. C23F 4/04
[52] U.S. Cl. ............................. 204/192.32; 156/345; 204/298.34; 204/298.37
[58] Field of Search ............... 204/192.32, 192.33, 204/298 PS, 298 E, 298 EP, 298 ET, 298 EE, 298.31, 298.32, 298.34, 298.08, 298.37; 156/345, 643, 646

[56] References Cited

U.S. PATENT DOCUMENTS

| | | | |
|---|---|---|---|
| 4,526,643 | 7/1985 | Okano et al. | 204/298 EE |
| 4,572,759 | 2/1986 | Benzing | 204/298 EP |
| 4,585,516 | 4/1986 | Corn et al. | 204/192.32 X |
| 4,618,477 | 10/1986 | Babu et al. | 156/345 X |
| 4,756,810 | 7/1988 | Lamont, Jr. et al. | 204/192.32 X |
| 4,808,258 | 2/1989 | Otsubo et al. | 204/192.32 X |
| 4,842,707 | 6/1989 | Kinoshita | 204/298 EE |

OTHER PUBLICATIONS

J. W. Coburn, "Plasma Etching and Reactive Ion Etching", pp. 1-23, AVS Monograph Series (1982).

Primary Examiner—Nam X. Nguyen
Attorney, Agent, or Firm—Hill, Van Santen, Steadman & Simpson

[57] ABSTRACT

The apparatus includes a means for generating a magnetic field at a first electrode to which a high frequency voltage is applied and includes a generator for generating a rectangular low frequency voltage that is capacitively coupled to a second electrode which carries the substrate to be etched. The low frequency voltage comprises a negative half-wave having a short duration and a positive half-wave. The duration of the negative half-wave is selected to be shorter than a time constant for charging the substrate after a potential change corresponding to the amplitude of the half-wave and the positive half-wave is dimensioned so that the substrate remains free of charges on the average.

13 Claims, 1 Drawing Sheet

APPARATUS AND METHOD FOR REACTIVE ION ETCHING

BACKGROUND OF THE INVENTION

1. Field of the Invention

The present invention is directed generally to an apparatus and method for reactive ion etching wherein a high frequency plasma is generated between two electrodes, one of which carries a substrate to be etched.

2. Description of the Related Art

In a known apparatus for reactive ion etching, having a pair of electrodes between which is generated a high frequency plasma, a low frequency voltage having a sinusoidal waveform is applied by capacitive coupling to the electrode on which the substrate to be etched is arranged. A negative half-wave portion of the sinusoidal waveform acts as an extraction voltage for the ions. The sinusoidal waveform is applied as the extraction voltage because a generally insulating substrate electrically charges according to an exponential function due to the ion bombardment if an extraction voltage in the form of a negative DC voltage is applied to the second electrode. The electrical charging of the substrate reduces the ion energy and etching comes to a standstill.

By applying a low frequency, sinusoidal voltage having a negative half-wave to the second electrode, the electrical charging of the substrate effected by ion bombardment which is due to electron bombardment during the positive half-wave of the voltage is avoided. A moderate equilibrium potential, or voltage, is formed at the substrate on which, however, the low frequency voltage continues to be superimposed. The ion energy is thus not constant.

SUMMARY OF THE INVENTION

It is an object of the present invention to provide an apparatus for reactive ion etching with which a high ion energy can be achieved and/or obtained that leaves the substrate free of charges on the average. The invention also provides method for reactive ion etching which avoids the generation of an average charge on the substrate yet which achieves high ion energies.

These and other objects and advantages of the invention are achieved by an apparatus including a generator for generating a low frequency voltage having a negative half-wave which has a short duration in comparison to a time constant for electrical charging of the substrate and having a positive half-wave dimensioned with a duration and/or amplitude which is of such dimensions that the substrate either remains free of charges on the average or remains negatively charged.

It is especially advantageous when the generator in the apparatus of the invention generates at least a generally rectangular, or square wave, voltage. The extraction voltage for the ions is essentially constant during the duration of the essentially rectangular negative half-wave. This results in a beneficial, narrow band ion energy spectrum.

When the negative half-wave and the positive half-wave are of such duration and amplitude that the current densities of the ions and electrons bombarding the substrate are different and such that the substrate charges to a potential $U_O$ which is negative relative to ground, then an ion energy $E_I$ is established according to the formula $E_I = e(U_O + U_{NF})$, whereby UNF denotes the overall amplitude of the low frequency voltage and e denotes the amount of the electrical charge of an electron.

When the ion energy is to be directly set by the amplitude of the negative half-wave of the low-frequency voltage, the amplitude of the positive half-wave is dimensioned so that the substrate remains free of a charge on a chronological average. In other words, the average substrate charge $U_o = 0$ volts.

The setting of the substrate potential to the 0 voltage level or to some other potential is accomplished by a control means. The control means senses a main equilibrium potential of the second electrode that is generated by the low frequency voltage from the generator and controls the low frequency voltage generated by the generator. The generator is controllable with reference to the positive and negative half-waves to a predetermined rated potential by setting the negative half-wave and positive half-wave. The substrate potential is controlled to the rated potential, which is preferably ground potential, or 0 volts.

Particularly when the rated potential is 0 volts, it is advantageous when the amplitude of the negative half-wave is controllable to thereby vary the ion energy.

As already mentioned, a high frequency plasma is generated between the electrodes in an apparatus for reactive ion etching. The apparatus for reactive ion etching comprises two electrodes arranged at a distance from one another. This high frequency plasma accomplishes two things; first, it disassociates and ionizes the process gas in the housing; and, second, the ions are accelerated in the potential gradient between the plasma and the substrate to be processed on the other electrode and there they effect an "anisotropic" etching profile wherein the edges are vertical and no under etching occurs. See for example, the publication by J. W. Coburn, "Plasma-Etching and reactive ion etching", AVS Monograph Series (1982), and in particular examples pages 2 and 4 thereof.

For the sake of fast and material-sparing etching, the ion density should be high and the ion energy should be low. A high ion density is obtained in an apparatus for reactive ion etching comprising two electrode arranged at a distance from another between which a high frequency plasma is generated by applying a high frequency voltage to one of the electrodes, whereby a substrate to be etched is arranged on the other electrode, and including a means for generating a magnetic field in a region between the two electrodes, the field strength of the magnetic field decreasing from the one electrode in the direction toward the other electrode and the field lines of the magnetic field proceeding transversely relative to this direction.

These features achieve a close concentration of the electrons and thus the plasma remains next to the one electrode. The electron orbits spiral around the field lines of the magnetic field and therefore ionize only this region. The ion density is thus increased and the bombardment of the substrate with electrons is diminished.

In an apparatus having two electrodes at a distance from one another between which a high frequency plasma is generated by applying a high frequency voltage to one electrode and a low frequency voltage applied by capacitive coupling to the other electrode on which the substrate to be etched is arranged does not permit the ion density and ion energy to be set independently of one another since both are dependent on the high frequency energy.

To arrive at a quasi-independent setting of these to parameters, a triode configuration is proposed. This configuration differs from the above apparatus in that a lattice or grating is arranged between the two electrodes. A high frequency plasma is maintained between the lattice and the one electrode to which the high frequency voltage is applied and thus the ion density is set. A low frequency alternating voltage is applied between the lattice and second electrode which carries the substrate to accelerate the ions onto the substrate and provides the ion energy.

In a triode configuration, the ions and electrons recombine at the lattice and thereby again reduce the ion densities. In the excitation of the low frequency AC voltage, the ions receive a broad spectrum of energy. An optimum etching profile, however, is formed at only one energy.

By combining the features of the generator for generating a low frequency voltage, as described above, with the feature of a means for generating a magnetic field, also as described above, an independent adjustment of the ion density and ion energy is advantageously achieved which has the simultaneous advantage of a high ion density in that the ions receive a narrow spectrum of energies that can be set to the energy at which the optimum etching profile is established.

DETAILED DESCRIPTION OF THE PREFERRED EMBODIMENTS

Figure 1:
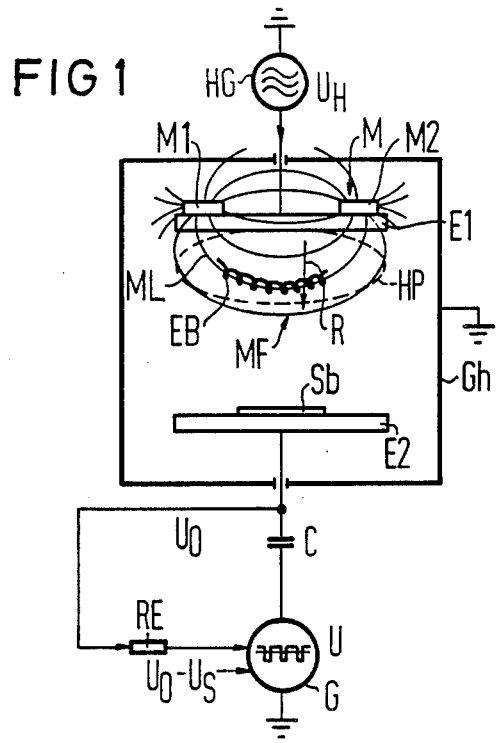
FIG. 1 is a schematic illustration of an exemplary embodiment of an apparatus according to the principles of the invention.

In FIG. 1, a housing Gh is filled or permeated with a processing gas and two electrodes E1 and E2 are arranged at a distance from one another within the housing Gh. A high frequency generator HG for generating a high frequency voltage $U_H$ is applied to the first upper electrode E1 for the purpose of generating a high frequency plasma HP between the two electrode E1 and E2. A generator G generates a low frequency voltage U that is applied via a capacitor C to the second lower electrode E2. A substrate Sb to be etched is arranged on the second other electrode E2, and a means M for generating a magnetic field MF with a field strength decreasing in a direction R from the first electrode E1 to the second electrode E2 and having field lines ML which proceed transversely relative to the direction R. For example, the low frequency voltage has a frequency of from 50 kHz through a few hundred kHz and is, for example, 50 kHz, whereas the high frequency signal lies in the MHz region such as, for example, at a frequency of 13.56 MHz.

As a consequence of the magnetic field MF defined above, the high frequency plasma is concentrated close to the first electrode E1. The electrons in the plasma spiral around the field lines ML of the magnetic field MF, such as is illustrated in FIG. 1 by a spiral orbit EB, and thus the electrons effect ionization only in this region. The ion density is thus increased again and the bombardment of the substrate with electrons is diminished. This eliminates the need for a lattice.

In the exemplary embodiment of FIG. 1, the means M for generating the magnetic field MF is composed of two permanent magnet bars M1 and M2 arranged at a distance from one another. As shown, the magnetic bars M1 and M2 are arranged on the first electrode E1.

Figure 2:
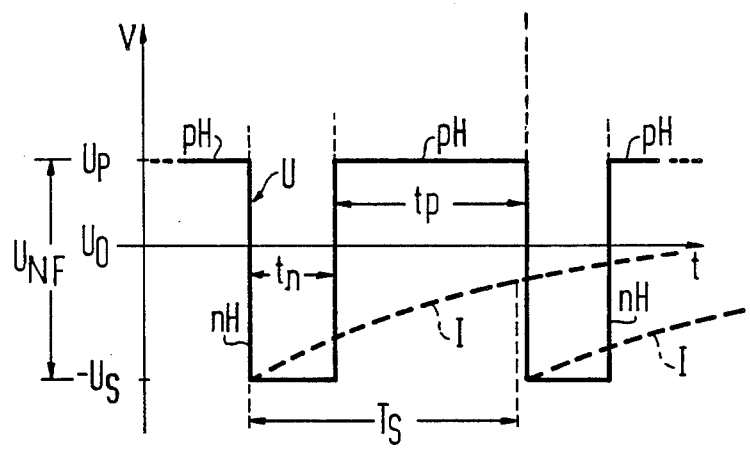
FIG. 2 is a graph showing a chronological curve of a rectangular low frequency voltage capacitively coupled to a second electrode of the apparatus according to FIG. 1, the low frequency voltage curve being compared to the chronological curve of the charging of the substrate applied to the second electrode.

The generator G generates a rectangular, low frequency voltage U having a chronological curve as shown in the graph of FIG. 2 in which time t is entered on the abscissa and voltage v is entered on the ordinate.

The voltage signal U from the generator G is overlaid with a mean equilibrium potential $U_O$ that forms at the substrate Sb and thus at the second electrode E2. The overall amplitude of the low frequency voltage U is referenced $U_{NF}$.

With reference to the equilibrium potential $U_O$, the voltage U has a negative half-wave nH having an amplitude use of $U_o - U_s$ and a positive half-wave pH having an amplitude of $U_p - U_o$. Of course, as can be seen by reference to FIG. 2, the terms half-wave do not limit the positive and negative signal portions to being of equal duration nor of equal amplitude. The term half-wave is merely used for the sake of convenience.

A curve I, shown in dashed outline, represents the chronological curve of the charging of the substrate Sb after a potential change from the mean equilibrium potential $U_o$ to the potential $-U_s$. The curve I represents as exponential function by which the potential of the substrate Sb would approach a new, higher equilibrium potential as time t increases after a voltage change. A time constant $T_s$ for the exponential function I is qualitatively shown in FIG. 2.

A duration $t_n$ of the negative half-wave nH during which the substrate Sb is bombarded by ions has a time duration shorter than the time constant $T_s$. The charging of the substrate Sb by ion bombardment only ensues during this short duration $t_n$ and is therefore relatively low. The amplitude $U_o - U_s$ that is constant during the duration $t_n$ and that is effective as an extraction voltage, changes only slightly during the duration $t_n$ so that a narrow spectrum of energies is established for the ions during this time. For the positive half-wave pH, either the duration $t_p$ thereof and/or the amplitude $U_p - U_O$ is dimensioned so that the electron bombardment of the substrate Sb during the duration $t_p$ cancels the slight charging of the substrate Sb, or more than cancels it, so that the substrate Sb remains free of charges on the average or remains negatively charged. The positive halfwave pH is preferably dimensioned so that the substrate Sb remains free of charges and so that $U_O = 0$ volts, which results in the ion energy depending only on the potential $U_s$ when a generator G is selected with which the amplitude of the potential $U_s$ is controllable, the ion energy can then be controlled by only adjusting this amplitude.

A mean equilibrium potential of the substrate of 0 volts can be maintained with a control means that senses the mean equilibrium potential $U_o$ of the second electrode E2 and controls it to a value of 0 volts by setting the duration $t_p$ or/and the amplitude $U_p$.

Thus, there is disclosed an apparatus for reactive ion etching which has the advantage of high ion density and low ion energy whereby the ion density and ion energy can be set independently of one another.

Although other modifications and changes may be suggested by those skilled in the art, it is the intention of the inventor to embody within the patent warranted hereon all changes and modifications as reasonably and properly come within the scope of his contribution to the art.

I claim:

1. An apparatus for reactive ion etching of a substrate, comprising:
   two electrodes arranged at a distance from one another;
   means for applying a high frequency voltage to a first of said two electrodes to generate a high frequency plasma between said two electrodes;
   a second of said two electrodes being adapted to receive a substrate to be etched, the substrate having a charging time constant;
   a generator for generating a low-frequency voltage having a negative signal portion of shorter duration than the charging time constant of the substrate and having a positive signal portion of a dimension so that the substrate has a non-positive average charge during etching; and
   means for capacitively coupling said low-frequency voltage to said second electrode.

2. An apparatus as claimed in claim 1, wherein said generator generates a square-wave signal as said low frequency 3. An apparatus as claimed in claim comprising:
   a control means for controlling said low frequency voltage of said generator by setting said negative and positive signal portions to achieve a predetermined rated potential.

4. An apparatus as claimed in claim 3, wherein said predetermined rated potential is ground.

5. An apparatus as claimed in claim 4, wherein said control means includes means for controlling an amplitude of said negative signal portion 6. An apparatus as claimed in claim 1, further comprising:
   means for generating a magnetic field in a region between said two electrodes, said magnetic field having a field strength which decreases in a direction from one of said two electrodes to another of said two electrodes and said magnetic field having field lines proceeding transverse to said direction.

7. An apparatus as claimed in claim 6, wherein said means for generating a magnetic field comprises two permanent magnet bars arranged at a distance from one another and arranged at one of said two electrodes.

8. An apparatus as claimed in claim 1, wherein said negative and positive signal portions are half-waves.

9. A method for reactive ion etching of a substrate, comprising the steps of:
   generating a high frequency plasma between two electrodes by applying a high frequency voltage to one of said electrodes;
   arranging a substrate to be etched at another of said two electrodes;
   applying a low frequency voltage to said another of said two electrodes, said low frequency voltage having a negative wave portion of a shorter duration than a charging time constant for electrical charging of the substrate, said low frequency voltage having a positive wave portion of such dimension that the substrate remains free of charges on average or remains negatively charged.

10. A method as claimed in claim 9, wherein said positive wave portion is dimensioned in duration to achieve a non-positive average charge.

11. A method as claimed in claim 9, wherein said positive wave portion is dimensioned in amplitude to achieve a nonpositive average charge.

12. An apparatus for reactive ion etching of a substrate, comprising:
   a housing filled with a process gas;
   first and second electrodes arranged in said housing at a distance from one another, a substrate to be etched being arranged on said second electrode;
   a high frequency generator having an output connected to said first electrode to apply a high frequency signal to said first electrode for generating a high frequency plasma;
   a low frequency generator having an output co to said second electrode to apply a low frequency signal to said second electrode, said low frequency signal being a generally rectangular voltage with a negative signal portion of a duration less than a charging time constant of the substrate on said second electrode and a positive signal portion of a dimension to at least cancel any charging of the substrate by the negative signal portion; and
   means for generating a magnetic field between said first and second electrodes with magnetic field lies extending transversely relative to a direction between said first and second electrodes.

13. An apparatus as claimed in claim 12, wherein said means for generating a magnetic field includes two permanent bar magnets arranged at a distance from one another and being arranged on one of said first and second electrodes.

* * * * *